United States Patent
Poskatcheev

(10) Patent No.: US 6,674,312 B2
(45) Date of Patent: Jan. 6, 2004

(54) DIFFERENTIAL SIGNAL RECEPTION DEVICE AND METHOD FOR SUPPORTING VARIABLE THRESHOLD LEVELS

(75) Inventor: Andrei Poskatcheev, Menlo Park, CA (US)

(73) Assignee: Synthesys, Menlo Park, CA (US)

( * ) Notice: Subject to any disclaimer, the term of this patent is extended or adjusted under 35 U.S.C. 154(b) by 0 days.

(21) Appl. No.: 10/099,569

(22) Filed: Mar. 15, 2002

(65) Prior Publication Data

US 2003/0174000 A1 Sep. 18, 2003

(51) Int. Cl.$^7$ ................................................. H03K 5/22
(52) U.S. Cl. ............................................ 327/67; 327/89
(58) Field of Search ............................... 327/65–67, 89, 327/563; 326/30; 330/252, 253

(56) References Cited

U.S. PATENT DOCUMENTS

| | | | | |
|---|---|---|---|---|
| 5,942,922 A | * | 8/1999 | Dinteman et al. | 327/108 |
| 6,084,424 A | * | 7/2000 | Gasparik | 326/30 |
| 6,373,277 B1 | * | 4/2002 | Felder | 326/30 |
| 6,448,815 B1 | * | 9/2002 | Talbot et al. | 326/86 |
| 6,504,397 B1 | * | 1/2003 | Hart et al. | 326/30 |

* cited by examiner

*Primary Examiner*—Kenneth B. Wells
(74) *Attorney, Agent, or Firm*—Douglas A. Chaikin; Peninsula IP Group

(57) ABSTRACT

A differential signal reception device and method for supporting variable threshold levels. The device flexibly makes an input to the decision circuit appear to an outside driving circuit as if the decision circuit were a purpose-built input network supporting a fixed impedance input into either a floating or fixed DC termination voltage. The device further allows the internal decision process to support a variable threshold level when deciding logical 1/0 values and to attenuate the users input signal range for the purpose of making sure the range of the user's signals do not exceed the operating range of readily available decision circuit (limiting amplifier) integrated circuits.

8 Claims, 2 Drawing Sheets

DIFFERENTIAL SIGNAL RECEPTION DEVICE AND METHOD FOR SUPPORTING VARIABLE THRESHOLD LEVELS

BACKGROUND OF THE INVENTION

The present invention relates to a differential signal reception device and method for supporting variable threshold levels.

Differential signaling is widely used to communicate voltages between integrated circuits or systems because of the benefit of removing common-mode noise. In digital data communications systems that employ differential signaling, both inputs are typically given to a differential input limiting amplifier to decide the logic level of the input signal. This limiting amplifier will have a logic high if the true input is higher in voltage than the negated input. The function of a limiting amplifier allows the device to have higher performance than a linear amplifier. That function is to drive the output as hard as it can any time the true input is higher than the negated input.

This is a high-performance way to decide the logic level of the signal, as differential input limiting amplifiers having non-linear gain are commonly available with much higher bandwidths than linear amplifiers. An alternative way to achieve this function is to put the two differential inputs into a differential linear amplifier which will create the analog "difference" signal and then to send this "difference" signal to a logic comparator that will output a logic true if the "difference" is positive and a logic false if the "difference" is negative. This alternative is limited by the bandwidth of the linear amplifier used.

SUMMARY OF THE INVENTION

The present invention relates to a differential signal reception device and method for supporting variable threshold levels.

It is an object of the present invention to flexibly make an input to this decision circuit appear to an outside driving circuit as if the decision circuit were a purpose-built input network supporting a fixed impedance input into either a floating or fixed DC termination voltage. It is also an object of the present invention to further allow the internal decision process to support a variable threshold level when deciding logical 1/0 values and to attenuate the users input signal range for the purpose of making sure the range of the user's signals does not exceed the operating range of readily available decision circuit (limiting amplifier) integrated circuits.

In one embodiment, the differential signal reception device according to the present invention includes means for receiving an input differential signal from a differential signal source, a variable threshold voltage, and a termination voltage from a controller (e.g. a computer); a variable decision threshold means for providing a variable decision threshold voltage corresponding to level shifts of the threshold voltage; and a differential limiting amplifier responsive to the threshold means for switching between high or low states.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention, where like numerals identify like components, and, together with the following detailed description, serve to explain the principles of the invention.

DETAILED DESCRIPTION OF THE INVENTION

Figure 1:
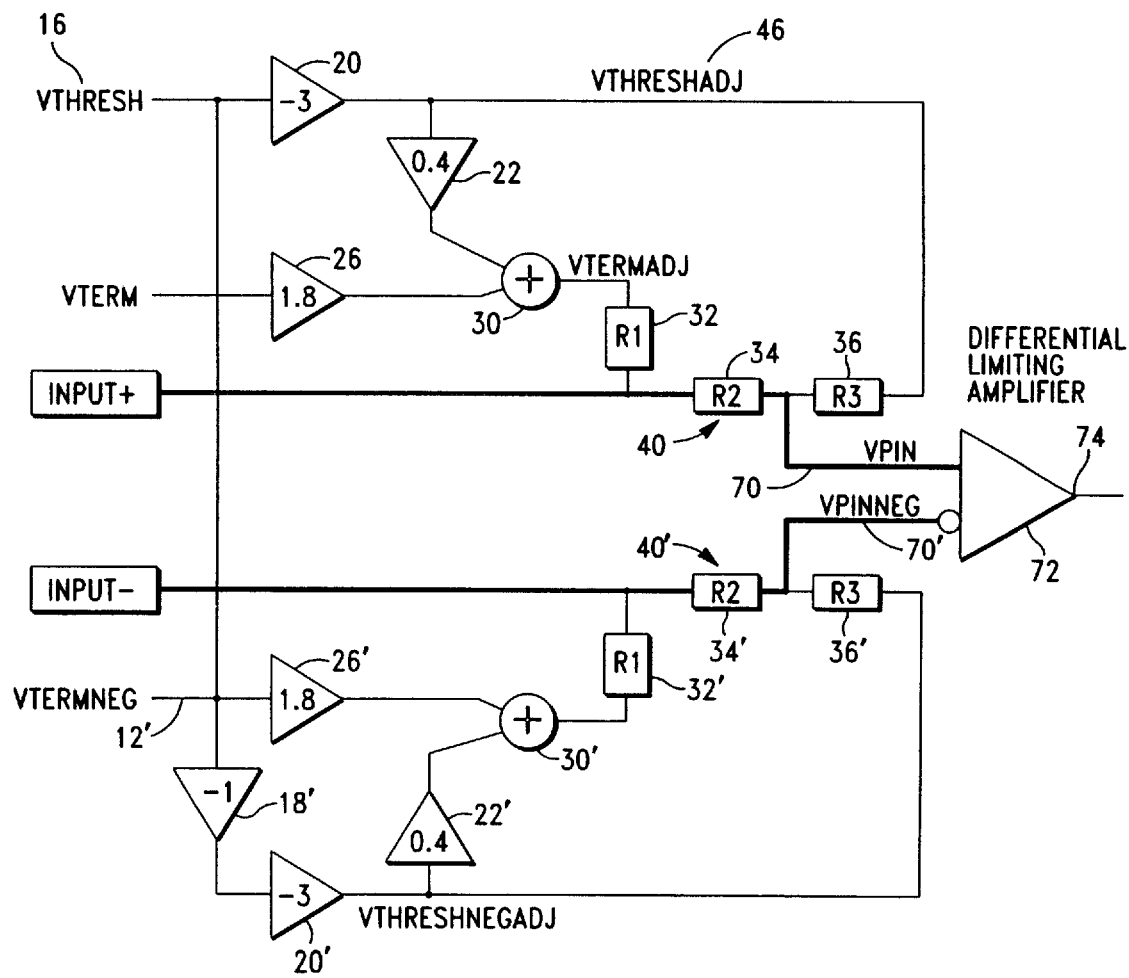
FIG. 1 shows a block diagram of a differential signal reception device according to the present invention.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention relates to a differential signal reception device and method.

Differential signaling is widely used to communicate voltages between integrated circuits or systems because of the benefit of removing common-mode noise. In digital data communications systems that employ differential signaling, both inputs are given to a differential input limiting amplifier to decide the logic level of the input signal. This limiting amplifier will have a logic high if the true input is higher in voltage than the negated input. The function of a limiting amplifier allows the device to have higher performance than a linear amplifier. This function drives the output as hard as it can any time the true input is higher than the negated input.

This is a high-performance way to decide the logic level of the signal as differential input limiting amplifiers having non-linear gain are commonly available with much higher bandwidths than linear amplifiers. An alternative way to achieve this function is to put the two differential inputs into a differential linear amplifier which will create the analog "difference" signal and then to send this "difference" signal to a logic comparator that will output a logic true if the "difference" is positive and a logic false if the "difference" is negative. This alternative is limited by the bandwidth of the linear amplifier used.

Variable logic thresholds are often required in systems to allow the voltage point where the logic decision is made to be changed. Changing the threshold level may be done for test purposes (e.g. for accelerated margin tests) or it may well be done to optimize the exact sampling point for the best communications performance. Without variable thresholds, a logic decision is made purely on whether or not the true in put is above the negated input. With variable thresholds, the logic decision is made when the true input exceeds the negated input by some "threshold" amount.

By using a linear amplifier, it is very apparent how one would create variable thresholding to the logic level detection process. The result of the differential linear amplifier is to create a "difference" signal. This signal must be greater than a "threshold" amount and can easily be determined by using a simple single-ended logic comparator device with one input being the "difference" signal and the other input being the "threshold" signal.

It is desireable to create a way that variable threshold levels can be incorporated into the logic detection process when using differential signals directly without the need for a linear amplifier.

It is also commonplace in electronic signaling systems to support multiple logic families. This convenience allows for flexibility and re-use. Different logic families provide different amplitude and offset input signals to the inputs of the logic decision circuit and expect different types of termination voltage schemes. The variety of commonly used voltage families forces a constraint onto the design of a flexible differential input circuit caused by the wide range of signal amplitudes and offsets. This wide range of signal amplitude and offset is so large as to be very difficult to handle directly by commonly available integrated circuits; however, by attenuating the input circuit, this wide range can be accommodated.

It is desireable for an input circuit to support attenuation of the input signals.

The different logic families also require different termination voltage schemes. Some families require an AC-coupled "floating" termination, some require a DC voltage (e.g. minus 2V for ECL logic) while others require the more simple 0V DC termination.

It is desireable to an input circuit to support both AC and DC termination voltages. It is desireable to simultaneously achieve variable thresholding, variable termination schemes and configurable amplitude attenuation.

A differential input signal consists of two input voltages (true and negated inputs) for each signal carried. The signal itself is the mathematical difference between the true and negated input voltages. In the present invention, variable logic level thresholding is accomplished by "level shifting" one leg away from the other leg at the inputs to the differential input limiting amplifier by an amount proportional to the amount of variable threshold to apply while simultaneously maintaining a fixed DC-value or AC-coupled-value termination voltage apparent to the input signal and attenuating the input signal by an amount to allow the total range of the input signal required to cover all possible intended logic families voltage signals not to exceed limits of commonly available differential limiting amplifier inputs.

As described above it is an object of the present invention to flexibly make an input to this decision circuit appear to an outside driving circuit as if the decision circuit were a purpose-built input network supporting a fixed impedance input into either a floating or fixed DC termination voltage. It is also an object of the present invention to further allow the internal decision process to support a variable threshold level when deciding logical I/O values and to attenuate the user's input signal range for the purpose of making sure the range of the user's signals does not exceed the operating range of readily available decision circuit (limiting amplifier) integrated circuits.

As will be described in more detail in conjunction with FIG. 1, a VTERM voltage 12 is introduced to a compensation circuit 10 for each input differential signal 14, 14' of the differential pair. While the method of introducing VTERM voltage 12 can be controlled by the user, a preferred method is to either take the arithmetic mean of the DC components of the two signals 14, 14', and may be accomplished by averaging each signal with a low pass filter, then taking the midpoint of the two signals or to provide this DC voltage from a programmable voltage source such as a D/A converter directly.

For purposes of describing the present invention, the true inputs will be described in conjunction with FIG. 1. The description of the negated elements (e.g., 14', 12', 18', . . .) would be similar.

As seen in FIG. 1, a variable VTHRESH signal 16 is introduced, and combined with the VTERM signal 12. In a preferred embodiment, the VTHRESH signal 16 is multiplied by −3 by multiplier 20, so that the VTHRESH signal 16 is presented as −3*VTHRESH to multiplier 22. In this embodiment, the VTERM signal 12 is multiplied by 1.8 by multiplier 26 and becomes 1.8*VTERM for input to adder 30. To provide "tracking", or interactivity, between VTERM and VTHRESH, a portion of VTHRESH is fed back as VTHRESHADJ and summed with VTERM, such as 0.4*−3*VTHRESH summed in adder 30 with 1.8*VTERM to form VTERMADJ.

In this preferred embodiment, the modified VTERM input is then combined with the modified VTHRESH input, such as through a resistive divider network 40, which includes resistors 32 (R1), 34 (R2), 36 (R3).

With the proper choice of resistors in a resistor divider network 40, or other similar network, the common mode voltage can be effectively nulled, a threshold voltage is established, the effective input impedance is adjusted to match the impedance of the differential signal source, and input attenuation is achieved.

In some cases, such as a single input logical gate, a single ended input is desired. In this case, only one of the differential signals need be connected to the logical gate, the other can be left disconnected. Since the circuit still provides the proper termination and balanced input to the source of the differential signal, normally, this will result only in the common mode noise rejection being lost.

From the outside world, the input 14 to the circuit 10 of FIG. 1 appears as a fixed impedance (e.g. 50 ohms) to a termination voltage (VTERM) 12 created by either a programmable voltage or by sensing the average voltage of the input data stream ("floating" termination voltage). There are various ways the present invention can create a termination voltage. This includes a fixed DC voltage or a voltage derived by sensing the average voltage on the input signals. The termination voltage can be from a controller, such as a computer.

Figure 2A:
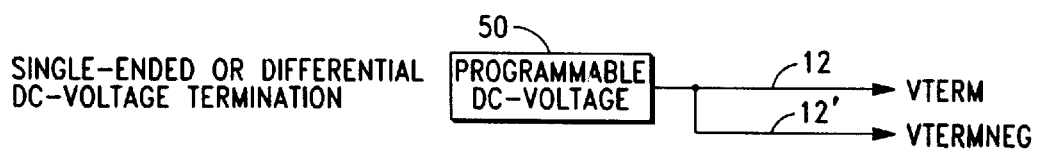
FIGS. 2A–2C show block diagrams of various termination voltage sources which can be utilized with the present invention.
Figure 2B:
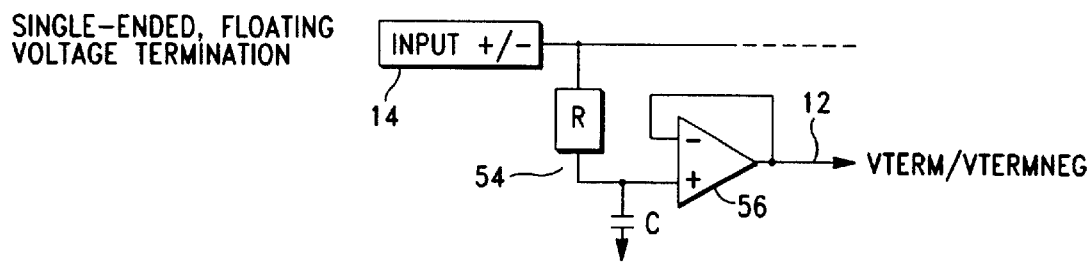
Figure 2C:
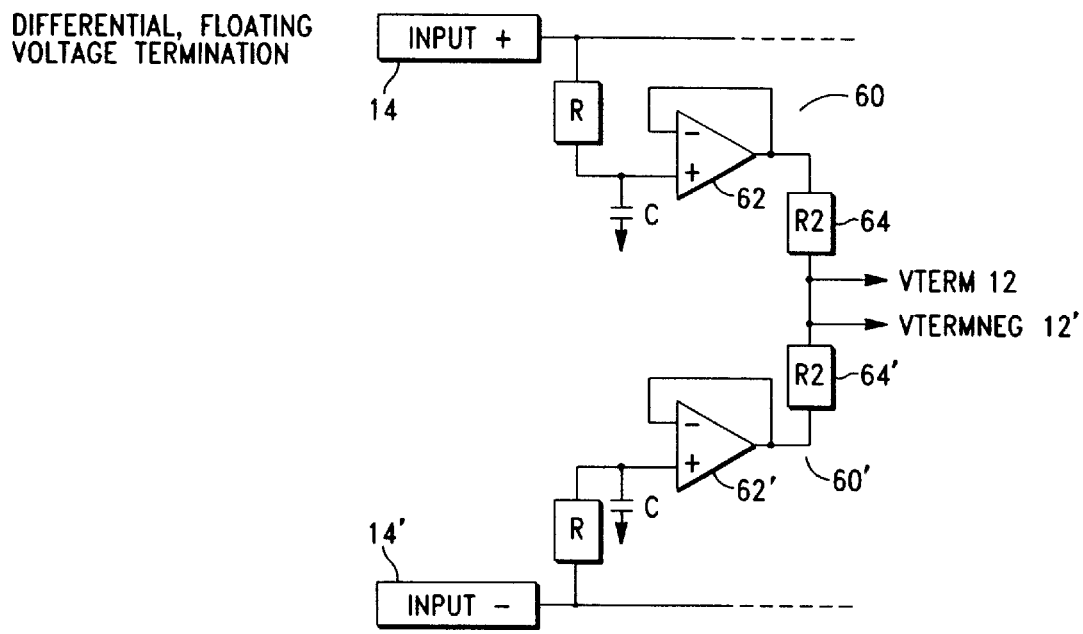

As shown in FIG. 2, four modes of termination voltage selection are supported: single-ended or differential DC-voltage termination (FIG. 2A); single-ended, floating point voltage termination (FIG. 2B): and differential, floating voltage termination (FIG. 2C).

First is a programmable DC voltage of FIG. 2A. In this case, VTERM is derived by a programmable D/A converter device 50 used to set the required termination voltage.

This termination voltage in FIG. 2A is used by both legs of the input differential signal 14 of FIG. 1.

Next, in FIG. 2B, the VTERM is individually derived on each leg of the input signal by independently finding the average voltage of the input signal. This average is created by using a low-pass filter 54 with a long RC time constant with amplifier 56 commensurate with industry-standard AC-coupling approaches. This creates a single-ended floating termination.

Finally, in FIG. 2C, VTERM can be created by taking the mid-point of the averages of both individual legs 14, 14', through circuit 60, which includes RC time constant and circuit, together with resistors 64, 64' (R2), and applying this as the termination voltage VTERM, VTERMNEG. This accomplishes a true floating differential input termination.

Referring again to FIG. 1, the termination impedance and voltage is created by setting voltages VTERMADJ 44 and VTHRESHADJ 46, as well as the resistor 32, 34, 36 values (R1, R2 and R3) such that the parallel equivalent of R1 with R2+R3 makes the desired termination impedance (e.g. 50 ohms) and the voltage divider created between VTERMADJ 44 and VTHRESHADJ 46 by resistors R1, R2 and R3 make the DC-voltage between R1 and R2 equal to the desired VTERM 12 value.

$$R_{termination} = \frac{R1 \cdot (R2 + R3)}{R1 + R2 + R3}$$

$$V_{termination} = V_{TERMADJ} - \frac{R1 \cdot (V_{TERMADJ} - V_{THRESHADJ})}{R1 + R2 + R3}$$

$$V_{THRESHADJ} = 3 \cdot V_{THRESH}$$
$$V_{TERMADJ} = 1.8 \cdot V_{TERM} + 1.2 \cdot V_{THRESH}$$

In order to achieve this, as shown in FIG. 1, an operational amplifier is used to create the VTERMADJ 44 output, reposition the output VTERMADJ 44 value depending on the VTHRESH 16 value (e.g., if VTHRESH rise, causing VTHRESHADJ to rise), then VTERMADJ must drop to maintain the same DC termination voltage VTERM to the user.

The effect of shifting the voltage to accommodate VTHRESH causes the voltage between R2 and R3 (VPIN 70) to also shift. It is this level shift at the pin 70 of the input (VPIN) to the differential limiting amplifier 72 that causes the variable threshold to be introduced to the decision circuit. This added voltage offset shift must be additionally accounted for between the two differential input signals 14, 14' before the output 74 of the limiting amplifier 72 will switch high or low.

The exact values chosen for resistors R1, R2 and R3 in FIG. 1 define the attenuation that also takes place during the level shifting process. In the preferred embodiment, the attenuation was set at 0.6667 making an input range of a user's signal of 6 volts map into a voltage range at the input pin 70 of 4 volts.

When used in a single-ended application, either leg of the input differential signal 14, 14' could be left disconnected (it does not matter which leg). In this case, though, the threshold level must be set at an appropriate absolute DC level typically midway between a logic high and logic low. Because of attenuations intentionally placed in the data path, similar attenuations must be algebraically applied to the absolute threshold values. In the preferred embodiment, the attenuation for the single-ended threshold amount was a factor of three. For example, to get a single-ended threshold of −1.85V, the VTHRESH signal 16 of FIG. 1 needs to be set to −0.458 Volts.

It is now apparent that the present invention attenuates the input circuit, maintains a fixed termination impedance and voltage and introduces a variable decision threshold. This process is simultaneously and symmetrically done on both legs of the input differential signal. In this way, a real variable threshold amount equal to twice VTHRESH is caused in the circuit. This is easily accounted for in software when providing VTHRESH voltage level from a D/A converter such that any desired threshold level can, in fact, be set.

Changes could be made to design parameters such as component values and amplifier gains that would create a similar solution, which would operate in an equivalent way. The values shown represent the preferred embodiment, but other embodiments could be done as well.

Similar circuits could be created that support multiple, simultaneous bit decisions and various different logic levels or that one of the differential inputs signals could be "left open" and not used allowing the same input network to operate in a "single-ended" operation way. This is a way the preferred embodiment operates.

Also, various circuit matching techniques employing bypass capacitors and inductors can be applied to this network to cancel-out the parasitic effects of non-perfect components and materials.

The present invention can be used with bit error rate testers which offer users flexible logic decision circuits along with analysis of the logic decision results. The logic decision circuit is key. High-speed is key. Variable thresholds are common on bit error rate testers allowing users the flexibility of seeing their signals performance at different logic decision levels. Differential signaling is more and more commonplace.

Other products that are not bit error rate testers may also require such circuits. For example, the circuit may also enable doing eye diagramming technology in other systems that are already differential in nature but that do not have convenient high-performance linear amplifiers (to do an alternative approach). A case in point is the input stage of an ALTERA or XILINX programmable logic component. These parts are strictly limiting amplifiers when it comes to high-speed. All linear amplification required in this circuit is low-speed and can be handled by very low-performance operational amplifiers.

A flexible differential input such as the present invention could be used in test instruments such as a TIA (time interval analyzer) or BERT (bit error rate tester). It could also be used in a communications system device such as a transceiver or modem. In a simple form, it could be used at the input of any differential input limiting amplifier to enable that amplifier to be used in more ways than just a plain differential input limiting amplifier.

Variable thresholds allow for analysis of the decision making process. By looking at the results of the decision making process when changes are done to the threshold allows one to characterize and predict the performance in other circumstances.

The present invention provides simultaneous solution of varying threshold amounts and termination voltage while achieving a fixed ratio attenuation. By changing the input variables and observing the voltage levels of both low and high logic levels, it is apparent that the network achieves the desired result.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A differential signal reception device comprising:
   means for receiving an input differential signal from a differential source, a variable threshold voltage, and a termination voltage from a controller;
   a variable decision threshold means for providing a variable decision threshold voltage corresponding to level shifts of the threshold voltage; and a differential limiting amplifier responsive to the threshold means for switching between high and low states.

2. The device as in claim 1 including a termination voltage and impedance network for maintaining a fixed termination impedance and voltage.

3. The device as in claim 2 including attenuation means for attenuating the received differential signal.

4. The device as in claim 3 including means for supporting AC termination voltages.

5. The device as in claim 3 including means for supporting DC termination voltages.

6. The device as in claim 3 including means for simultaneously supporting variable thresholding, variable terminations, and variable amplitude attenuations.

7. A differential signal reception device comprising:

means for receiving an input differential signal from a differential signal source, a variable threshold voltage, and a termination voltage from a controller;

a variable decision threshold means for providing a variable decision threshold voltage corresponding to level shifts of the threshold voltage;

a termination voltage and impedance network for maintaining a fixed termination impedance and voltage;

attenuation means for attenuating the received differential signal; and a differential limiting amplifier responsive to the threshold means for switching between high and low states.

8. In a differential signal reception device including a differential limiting amplifier, a method comprising the steps of:

receiving an input differential signal from a differential signal source, a variable threshold voltage, and a termination voltage from a controller;

providing a variable decision threshold voltage corresponding to level shifts of the threshold voltage; and switching the differential limiting amplifier between high and low states in response to the variable decision threshold voltage.

\* \* \* \* \*